US008922240B2

(12) United States Patent
Song

(10) Patent No.: US 8,922,240 B2
(45) Date of Patent: Dec. 30, 2014

(54) TERMINATION CIRCUIT

(75) Inventor: Seong-Hwi Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 70 days.

(21) Appl. No.: 13/606,141

(22) Filed: Sep. 7, 2012

(65) Prior Publication Data

US 2013/0162288 A1   Jun. 27, 2013

(30) Foreign Application Priority Data

Dec. 21, 2011   (KR) .................. 10-2011-0139587

(51) Int. Cl.
*H03K 17/16* (2006.01)
*H03K 19/003* (2006.01)

(52) U.S. Cl.
USPC .................. 326/30; 326/34; 326/87

(58) Field of Classification Search
None
See application file for complete search history.

(56) References Cited

U.S. PATENT DOCUMENTS

| 7,894,260 | B2 * | 2/2011 | Lee et al. .................. 365/185.05 |
| 7,944,232 | B2 * | 5/2011 | Jang ................................ 326/30 |
| 8,324,927 | B2 * | 12/2012 | Bhakta et al. .................. 326/30 |
| 2008/0079457 | A1 * | 4/2008 | Yuan ............................... 326/30 |

FOREIGN PATENT DOCUMENTS

| KR | 100861308 | 10/2008 |
| KR | 1020110131368 | 12/2011 |

* cited by examiner

*Primary Examiner* — Anh Tran
(74) *Attorney, Agent, or Firm* — IP & T Group LLP

(57) ABSTRACT

A termination circuit includes: a pull-up termination unit configured to pull-up terminate an interface node in response to a pull-up signal; a pull-down termination unit configured to pull-down terminate the interface node in response to a pull-down signal; one or more pull-up resistors connected to the interface node and enabled to affect termination resistance in response to a pull-up setting value when a termination signal is activated; and one or more pull-down resistors connected to the interface node and enabled to affect termination resistance in response to a pull-down setting value when the termination signal is activated.

7 Claims, 8 Drawing Sheets

TERMINATION CIRCUIT

CROSS-REFERENCE TO RELATED APPLICATIONS

The present application claims priority of Korean Patent Application No. 10-2011-0139587, filed on Dec. 21, 2011, which is incorporated herein by reference in its entirety.

BACKGROUND

1. Field

Exemplary embodiments of the present invention relate to a termination circuit, which terminates an interface node for data output or impedance matching.

2. Description of the Related Art

Semiconductor devices including integrated circuit (IC) chips such as CPU, memory, and gate array are used in different electronic products such as personal computers, servers or workstations. Semiconductor devices often include a receiving circuit for receiving various signals transmitted from outside through an input pad and an output circuit for providing an internal signal to the outside through an output pad.

Meanwhile, with the increase in operation speed of electronic products, the voltage swing of a signal exchanged between semiconductor devices has gradually decreased to minimize a delay time in signal transmission. However, with the increase of the signal swing, external noise effect increases, and signal reflection caused by impedance mismatching at an interface terminal becomes more pronounced. The impedance mismatching is caused by external noise, variation in power supply voltage, change in operation temperature, change in fabrication process or the like. When the impedance matching occurs, it is difficult to transmit data at a high rate, and data outputted from a data output terminal of a semiconductor device may be distorted. Therefore, when a semiconductor device in a receiver side receives the distorted output signal through an input terminal thereof, undesirable features such as setup/hold fails or input level decision errors may frequently occur.

In particular, a memory device of which the operation speed is to be increased employs an impedance matching circuit called an on-die termination circuit, which is located around an input pad inside an IC chip, in order to address the above-described features. In a typical on-die termination scheme, source termination is performed by an output circuit in a transmitter side, and parallel termination is performed by a termination circuit connected in parallel to a receiving circuit connected to the input pad in a receiver side.

FIG. 1 is a configuration diagram of a conventional termination circuit. The termination circuit is used as an output driver when data (signal) is outputted and performs impedance matching of an interface pad when data (signal) is inputted.

Referring to FIG. 1, the termination circuit includes a pull-up termination unit 110, a pull-down termination unit 120, and a control unit 130.

The pull-up termination unit 110 is enabled in response to a pull-up signal PU_EN, and pull-up terminates an interface pad INTERFACE through which signals or data are inputted/outputted. A pull-up code PCODE<0:N> inputted to the pull-up termination unit 110 controls an impedance value of the pull-up termination unit 110. That is, whether the pull-up termination unit 110 is enabled or not is decided by the pull-up signal PU_EN, and the impedance value of the enabled pull-up termination unit 110 is controlled by the pull-up code PCODE<0:N>.

The pull-down termination unit 120 is enabled in response to a pull-down signal PD_EN, and pull-down terminates the interface pad INTERFACE. A pull-down code NCODE<0:N> inputted to the pull-down termination unit 120 controls an impedance value of the pull-down termination unit 120. That is, whether the pull-down termination unit 120 is enabled or not is decided by the pull-down signal PD_EN, and the impedance value of the enabled pull-down termination unit 120 is controlled by the pull-down code NCODE<0:N>.

The control unit 130 is configured to control whether or not to activate the pull-up signal PU_EN and a pull-down signal PD_EN. The operation of the control unit 130 is divided into a case where data is outputted to the interface pad INTERFACE and a case where data is inputted to the interface pad INTERFACE. Based on both cases, the operation of the control unit 130 will be described as follows.

(1) Operation of Control Unit 130 when Data is Outputted

When an output data value DATA is high, the control unit 130 activates the pull-up signal PU_EN. When the pull-up signal PU_EN is activated, the pull-up termination unit 110 is enabled. As a result, high-level data may be outputted to the interface pad INTERFACE. When the output data value DATA is low, the control unit 130 activates the pull-down signal PD_EN. When the pull-down signal PD_EN is activated, the pull-down termination unit 120 is enabled. As a result, low-level data may be outputted to the interface pad INTERFACE.

(2) Operation of Control Unit 130 when Data is Inputted

When data is inputted to the interface pad INTERFACE, a termination signal iODT is activated. The termination signal iODT is a signal to terminate the interface pad INTERFACE when data is inputted to the interface pad INTERFACE. When the termination signal iODT is activated, the control unit 130 activates both of the pull-up signal PU_EN and the pull-down signal PD_EN. Therefore, both of the pull-up termination unit 110 and the pull-down termination unit 120 are enabled, and the interface pad INTERFACE may be impedance-matched.

As described with reference to FIG. 1, the termination circuit outputs data to the interface pad INTERFACE using the same termination units 110 and 120, and matches the impedance of the interface pad INTERFACE when data is inputted. Accordingly, it is desirable to obtain an index indicating how much the impedance values of the pull-up termination unit 110 and the pull-down termination unit 120 are mismatched during the impedance matching operation of the termination circuit. Therefore, when the impedance values of the pull-up termination unit 110 and the pull-down termination unit 120 are mismatched, the impedance values are to be corrected. When the impedance values of the pull-up termination unit 110 and the pull-down termination unit 120 are corrected, impedance values during data output may also be changed. That is, according to the configuration of the conventional termination circuit, it is difficult to separately control the impedance values of the termination units 110 and 120 during data output and the impedance values of the termination units 110 and 120 during data input. Therefore, it is difficult to control the termination circuit to have optimal impedance values.

SUMMARY

An embodiment of the present invention is directed to a technology for separately controlling impedance values of a termination circuit during data input and during data output.

In accordance with an embodiment of the present invention, a termination circuit includes: a pull-up termination unit configured to pull-up terminate an interface node in response to a pull-up signal; a pull-down termination unit configured to pull-down terminate the interface node in response to a pull-down signal; one or more pull-up resistors connected to the interface node and enabled to affect termination resistance in response to a pull-up setting value when a termination signal is activated; and one or more pull-down resistors connected to the interface node and enabled to affect termination resistance in response to a pull-down setting value when the termination signal is activated.

In accordance with another embodiment of the present invention, a termination circuit includes: a pull-up termination unit configured to pull-up terminate an interface node in response to a pull-up signal; a pull-down termination unit configured to pull-down terminate the interface node in response to a pull-down signal; and one or more pull-up resistors connected to the interface node and enabled to affect termination resistance in response to a pull-up setting value when a termination signal is activated.

In accordance with yet another embodiment of the present invention, a termination circuit includes: a pull-up termination unit configured to pull-up terminate an interface node in response to a pull-up signal; a pull-down termination unit configured to pull-down terminate the interface node in response to a pull-down signal; and one or more pull-down resistors connected to the interface node and enabled to affect termination resistance in response to a pull-down setting value when a termination signal is activated.

In accordance with still another embodiment of the present invention, a termination circuit includes: a storage circuit configured to store and output a pull-up increase signal and a pull-down increase signal; an impedance control unit configured to receive and change the least significant bit (LSB) of a pull-up code and the LSB of a pull-down code, receive the pull-up increase signal and the pull-down increase signal, activate an additional pull-up code when the pull-up increase signal is activated, and activate an additional pull-down code when the pull-down increase signal is activated; a pull-up termination unit configured to pull-up terminate an interface node in response to a pull-up signal and comprising a plurality of pull-up resistors enabled to affect termination resistance in response to the respective bits of the pull-up code and an additional pull-up resistor enabled to affect termination resistance in response to the additional pull-up signal; and a pull-down termination unit configured to pull-down terminate an interface node in response to a pull-down signal and comprising a plurality of pull-down resistors enabled to affect termination resistance in response to the respective bits of the pull-down code and an additional pull-down resistor enabled to affect termination resistance in response to the additional pull-down signal.

DETAILED DESCRIPTION

Figure 1:
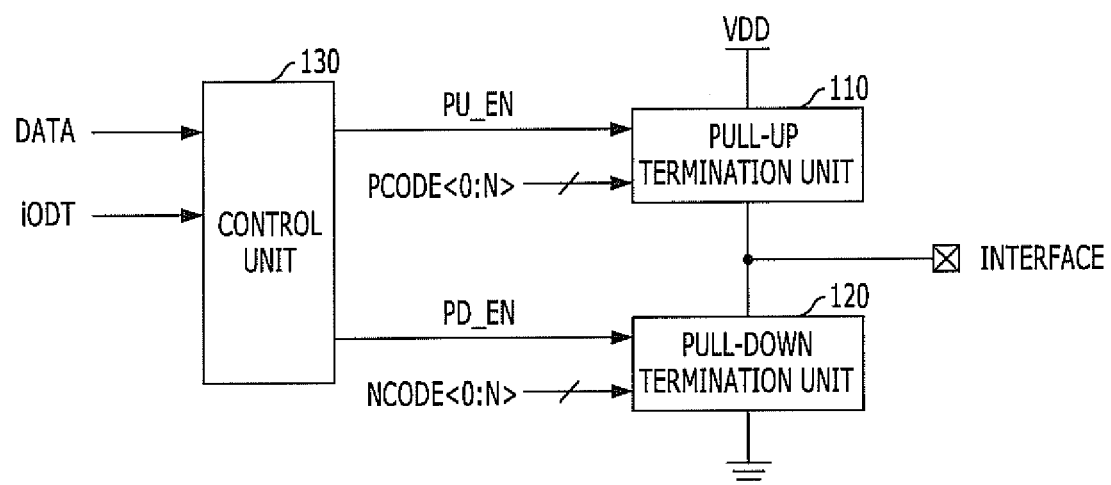
FIG. 1 is a configuration diagram of a conventional termination circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Embodiments for separately controlling impedance values of termination circuit during data output and during data input will be described below.

Figure 2:
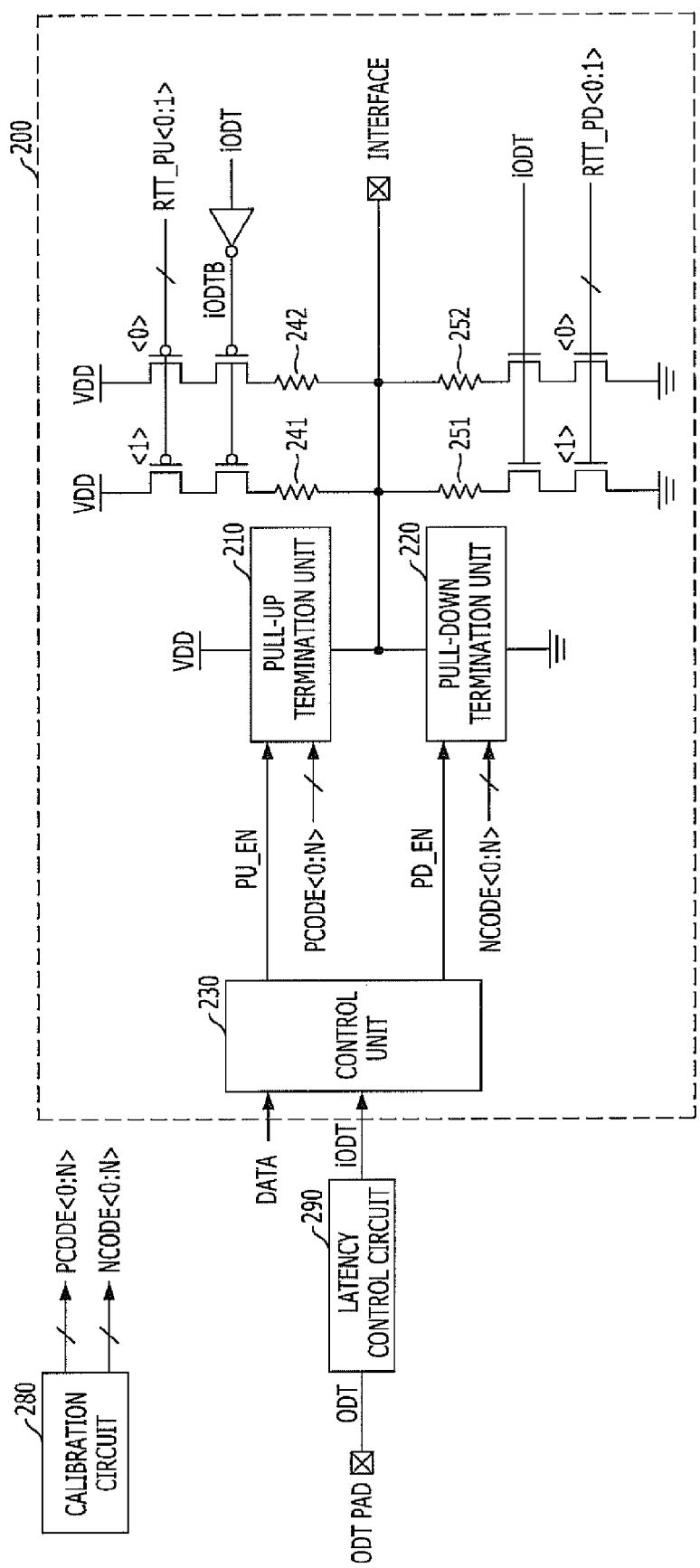
FIG. 2 is a configuration diagram of a termination circuit and peripheral circuits in accordance with an embodiment of the present invention.

FIG. 2 is a configuration diagram of a termination circuit and peripheral circuits in accordance with an embodiment of the present invention. FIG. 2 illustrates that the termination circuit 200 is applied to a memory. Depending on to which system the termination circuit 200 is applied, the peripheral circuits of the termination circuit 200 may be differently configured.

Referring to FIG. 2, the termination circuit 200 includes a pull-up termination unit 210, a pull-down termination unit 220, one or more pull-up resistors 241 and 242, one or more pull-down resistors 251 and 252, and a control unit 230. The peripheral circuits include a calibration circuit 280 for providing a pull-up code PCODE<0:N> and a pull-down code NCODE<0:N> to the termination circuit 200 and a latency control circuit 290 for providing a termination signal iODT to the termination circuit 200.

The calibration circuit 280 is configured to generate the pull-up code PCODE<0:N> and the pull-down code NCODE<0:N>. The pull-up code PCODE<0:N> and the pull-down code NCODE<0:N> are provided to control the pull-up termination unit 210 and the pull-down termination unit 220 to maintain the same impedance values at all times, even though PVT (Process, Voltage, and Temperature) variation occurs. The calibration circuit 280 is also known as a ZQ calibration circuit.

The latency control circuit 290 is configured to delay a termination command ODT inputted from outside the memory by a latency value and generate a termination signal iODT. The termination command ODT is a command to terminate an interface pad INTERFACE to which data (signals) are inputted. When the termination command ODT is activated, the memory performs a termination operation after a time corresponding to a constant latency (for example, WL-2 where WL is write latency) defined in the specification. For this operation, the latency control circuit 290 generates the termination signal iODT by delaying the termination command ODT by the latency value.

The pull-up termination unit 210 is enabled by the pull-up signal PU_EN, and pull-up terminates the interface pad INTERFACE through which signals or data are inputted/outputted. The pull-up code PCODE<0:N> inputted to the pull-up termination unit 210 controls the impedance value of the pull-up termination unit 210. That is, whether the pull-up termination unit 210 is enabled or not is decided by the pull-up signal PU_EN, and the impedance value of the enabled pull-up termination unit 210 is controlled by the pull-up code PCODE<0:N>.

The pull-down termination unit 220 is enabled by the pull-down signal PD_EN, and pull-down terminates the interface pad INTERFACE. The pull-down code NCODE<0:N> inputted to the pull-down termination unit 220 controls an impedance value of the pull-down termination unit 220. That is, whether the pull-down termination unit 220 is enabled or not is decided by the pull-down signal PD_EN, and the impedance value of the enabled pull-down termination unit 220 is controlled by the pull-down code NCODE<0:N>.

The control unit 230 is configured to control whether or not to activate the pull-up signal PU_EN and the pull-down signal PD_EN. The control unit 230 activates one of the pull-up signal PU_EN and the pull-down signal PD_EN during data output. When the termination signal iODT is activated, the control unit 230 activates both of the pull-up signal PU_EN and the pull-down signal PD_EN.

The pull-up resistors 241 and 242 are enabled to affect termination resistance in response to a pull-up setting value RTT_PU<0:1> when the termination signal iODT is activated. The pull-up resistors 241 and 242 are connected in series to transistors turned on/off by an inverted termination signal iODTB and transistors turned on/off by the pull-up setting value RTT_PU<0:1>, respectively. The pull-up resistors 241 and 242 are all disabled from having effect on termination resistance when the termination signal iODT is deactivated to a low level and enabled to affect termination resistance in response to the pull-up setting value RTT_PU<0:1> when the termination signal iODT is activated to a high level.

The pull-down resistors 251 and 252 are enabled to affect termination resistance in response to a pull-down setting value RTT_PD<0:1> when the termination signal iODT is activated. The pull-down resistors 251 and 252 are connected in series to transistors turned on/off by the termination signal iODT and transistors turned on/off by the pull-down setting value RTT_PD<0:1>, respectively. The pull-down resistors 251 and 252 are all disabled from having effect on termination resistance when the termination signal iODT is deactivated to a low level and enabled to affect termination resistance in response to the pull-down setting value RTT_PD<0:1> when the termination signal iODT is activated to a high level.

In accordance with the embodiment of the present invention, the termination circuit includes the pull-up resistors 241 and 242 and the pull-down resistors 251 and 252, which always maintain a disabled state from having effect on termination resistance during data output, and are enabled to affect termination resistance in response to the setting values RTT_PU<0:1> and RTT_PD<0:1>, for example, only during the termination operation (during input impedance matching). Therefore, the termination circuit may control the termination impedance values during the termination operation, while having no effect on termination resistance during data output.

FIG. 2 illustrates two pull-up resistors 241 and 242 and two pull-down resistors 251 and 252. However, the numbers of the pull-up resistors 241 and 242 and the pull-down resistors 251 and 252 may differ depending on different design needs. The pull-up setting value RTT_PU<0:1> and the pull-down setting value RTT_PD<0:1> may be received from outside the system to which the termination circuit 200 is applied or may be stored in a circuit such as a fuse circuit, which is provided in a system and may store data.

Figure 3:
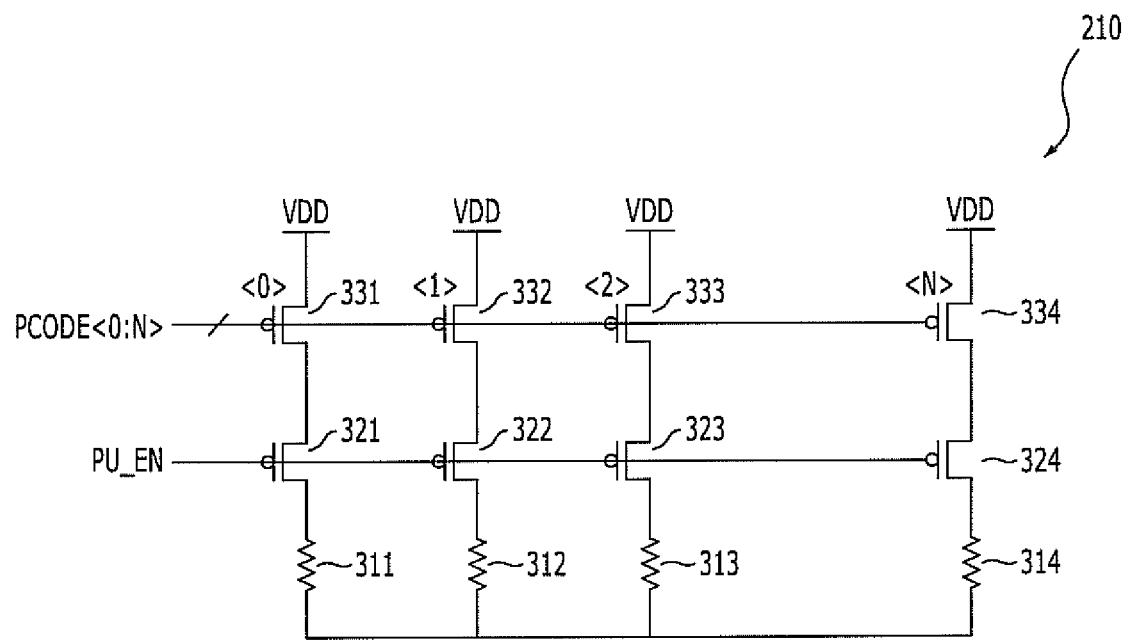
FIG. 3 is an internal configuration diagram of a pull-up termination unit.
Figure 4:
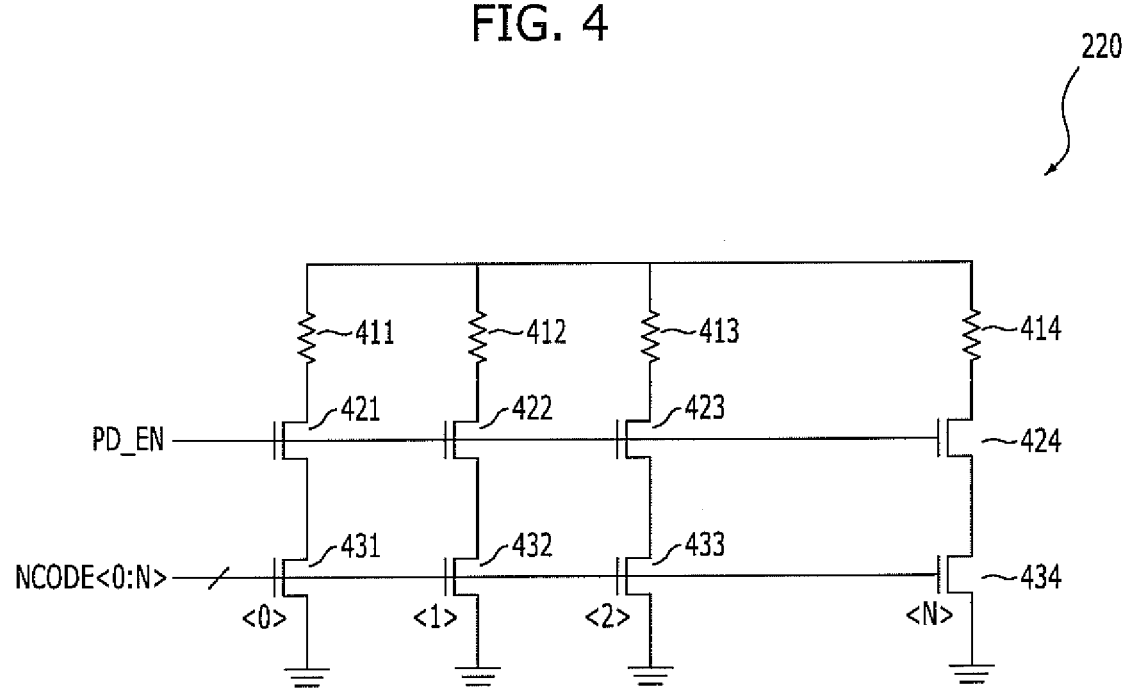
FIG. 4 is an internal configuration diagram of a pull-down termination unit.

FIG. 3 is an internal configuration diagram of the pull-up termination unit 210. FIG. 4 is an internal configuration diagram of the pull-down termination unit 220.

Referring to FIG. 3, the pull-up termination unit 210 includes a plurality of resistors 311 to 314. The resistors 311 to 314 are connected in series to transistors 321 to 324 and transistors 331 to 334, respectively. The transistors 321 to 324 are turned on when the pull-up signal PU_EN is activated to a low level, and the transistors 331 to 334 are turned on/off by the pull-up code PCODE<0:N>. When the pull-up signal PU_EN is deactivated to a high level, the resistors 311 to 314 do not affect termination resistance of the interface pad INTERFACE. When the pull-up signal PU_EN is activated to a low level, the resistors 311 to 314 are enabled to affect termination resistance in response to the pull-up code PCODE<0:1>, and the interface pad INTERFACE is terminated by resistors which are turned on among the transistors 311 to 314.

Referring to FIG. 4, the pull-down termination unit 220 includes a plurality of resistors 411 to 414. The resistors 411 to 414 are connected in series to transistors 421 to 424 and transistors 431 to 434, respectively. The transistors 421 to 424 are turned on when the pull-down signal PD_EN is activated to a high level, and the transistors 431 to 434 are turned on/off by the pull-down code NCODE<0:N>. When the pull-down signal PD_EN is deactivated to a low level, the resistors 411 to 414 do not affect termination resistance of the interface pad INTERFACE. When the pull-down signal PD_EN is activated to a high level, the resistors 411 to 414 are enabled to affect termination resistance in response to the pull-down code NCODE<0:N>, and the interface pad INTERFACE is terminated by resistors which are turned on among the resistors 411 to 414.

Figure 5:
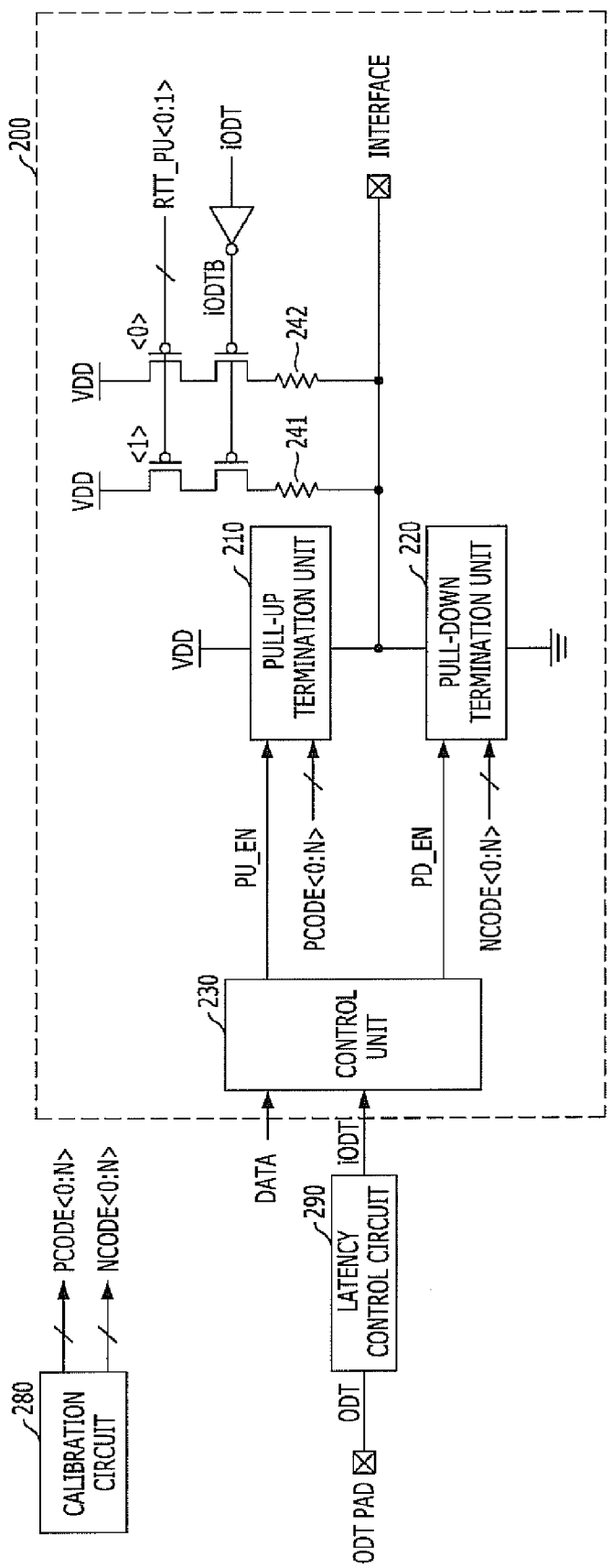
FIGS. 5 and 6 illustrate other embodiments of the termination circuit.
Figure 6:
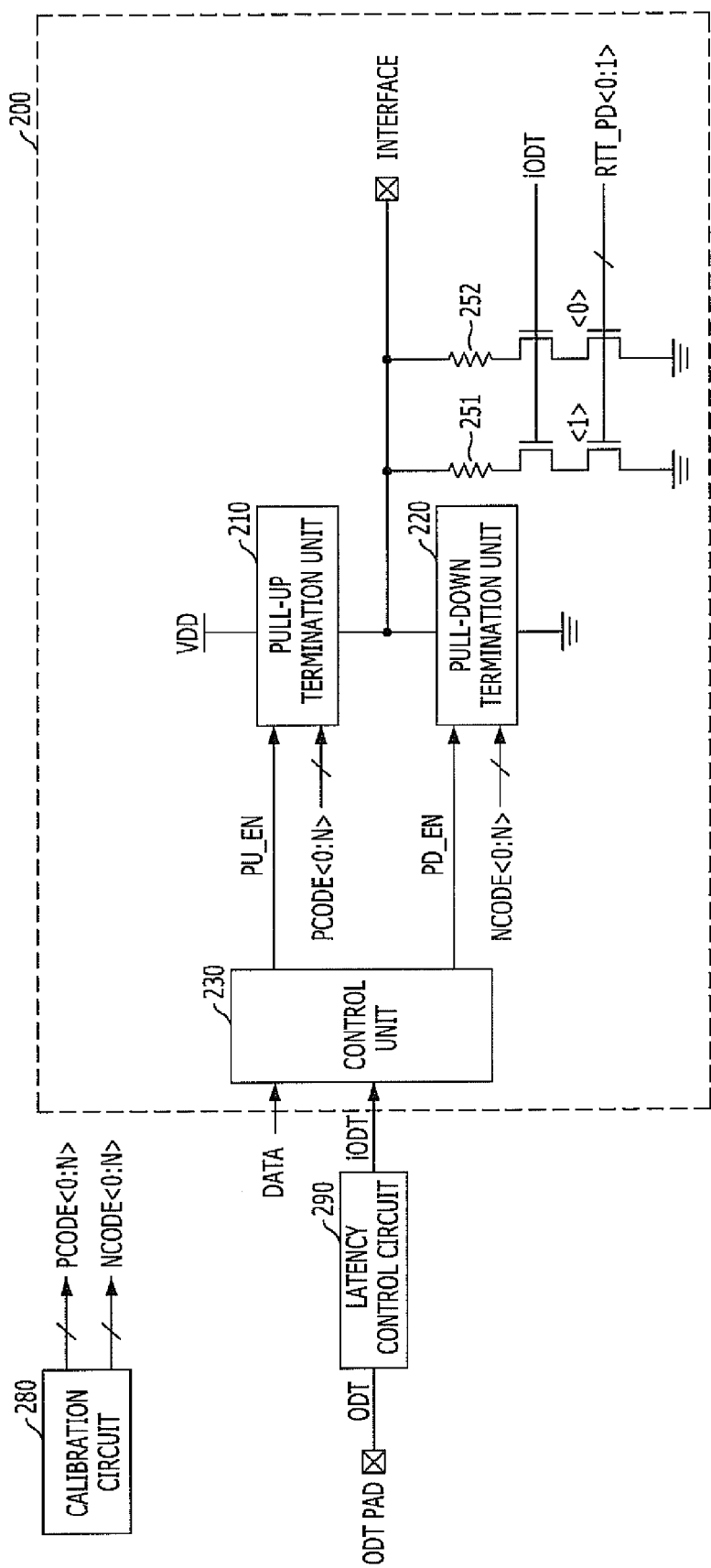

FIGS. 5 and 6 illustrate other embodiments of the termination circuit 200.

Referring to FIG. 5, the termination circuit 200 may include, for example, the pull-up resistors 241 and 242 only among the pull-up resistors 241 and 242 and the pull-down resistors 251 and 252. The impedance mismatching of the termination circuit is based on a relative value between pull-up impedance and pull-down impedance. Therefore, although only the pull-up resistors 241 and 242 are used, the impedance mismatching may be corrected.

Referring to FIG. 6, the termination circuit 200 may include, for example, the pull-down resistors 251 and 252 only among the pull-up resistors 241 and 242 and the pull-down resistors 251 and 252. That is because, although only the pull-down resistors 251 and 252 are used, the impedance mismatching between pull-up impedance and pull-down impedance of the termination circuit 200 may be corrected.

Figure 7:
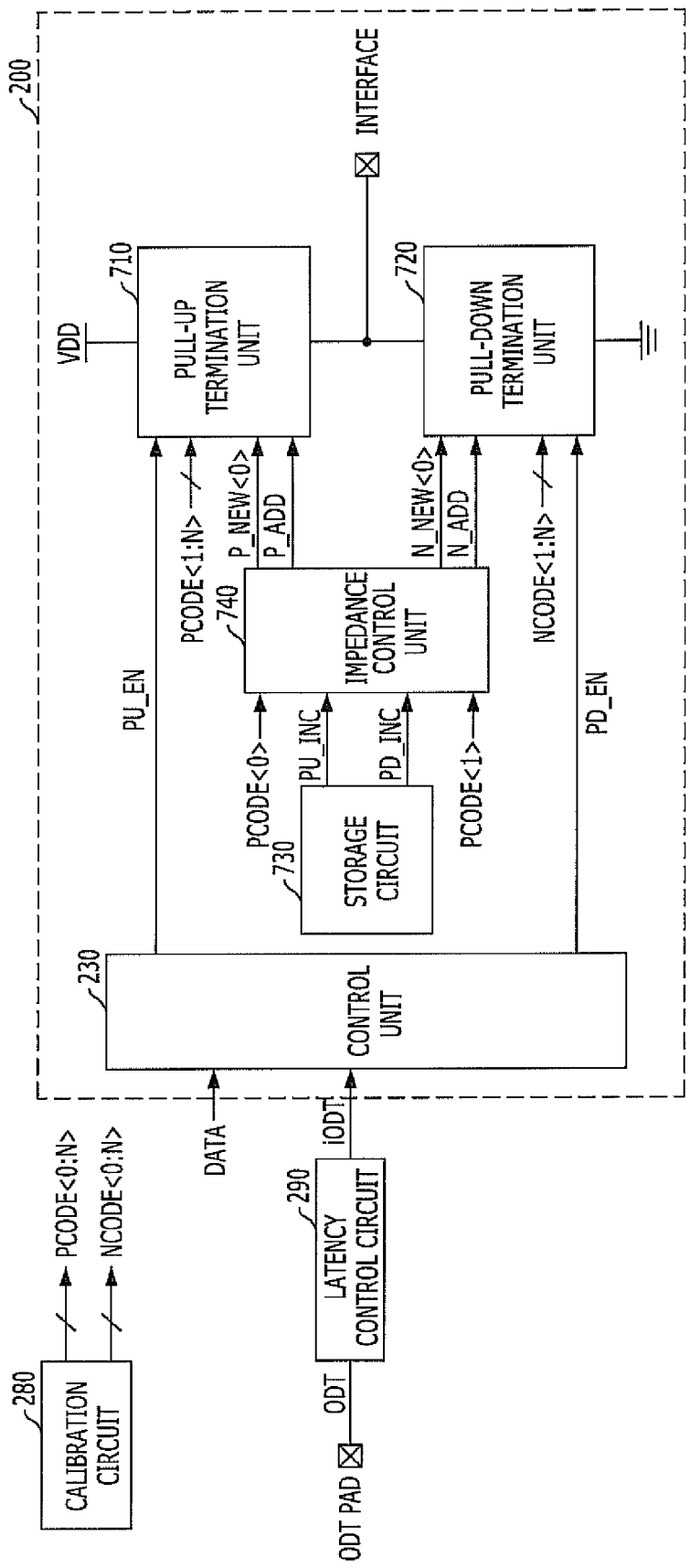
FIG. 7 illustrates an embodiment for changing impedance values of a pull-up termination unit and a pull-down termination unit in a termination circuit.

Embodiments for controlling impedance values of pull-up termination unit and pull-down termination unit of termination circuit are described below FIG. 7 illustrates an embodiment for changing impedance values of a pull-up termination unit 710 and a pull-down termination unit 720 in a termination circuit 200. In FIG. 7, the same components as those of FIG. 2 are represented by like reference numerals. In the embodiment of FIG. 7, a storage circuit 730 and an impedance control unit 740 are additionally provided, and the internal configurations of the pull-up termination unit 710 and the pull-down termination unit 720 are changed. Components related to the one or more pull-up resistors 241 and 242 and the one or more pull-down resistors 251 and 252, which have been described with reference to FIG. 2, may be included in the embodiment of FIG. 7. However, the components are not illustrated in FIG. 7.

The storage circuit 730 is configured to store a pull-up increase signal PU_INC and a pull-down increase signal PD_INC. The pull-up increase signal PU_INC is a signal to increase the impedance value of the pull-up termination unit 710 with respect to the pull-down termination unit 720, that is, a signal to increase the impedance value of the pull-up termination unit 710 or decrease the impedance value of the pull-down termination unit 720. The pull-down increase signal PD_INC is a signal to increase the impedance value of the pull-down termination unit 720 with respect to the pull-up termination unit 710, that is, a signal to increase the impedance value of the pull-down termination unit 720 or decrease the impedance value of the pull-up termination unit 710. The storage circuit 730 may include a fuse circuit having a fuse for storing the pull-up increase signal PU_INC and a fuse for storing the pull-down increase signal PD_INC. Furthermore, the storage circuit 730 may include a circuit configured to store the pull-up increase signal PU_INC and the pull-down increase signal PD_INC which are inputted from outside an IC chip to which the termination circuit is applied.

The impedance control unit 740 is configured to receive the least significant bit (LSB) PCODE<0> of the pull-up code, the LSB NCODE<0> of the pull-down code, the pull-up increase signal PU_INC, and the pull-down increase signal PD_INC, and generate a new LSB of the pull-up code, a new LSB of the pull-down code, an additional pull-up signal P_ADD, and an additional pull-down signal P_ADD. The detailed configuration and operation of the impedance control unit 740 will be described below.

Figure 8:
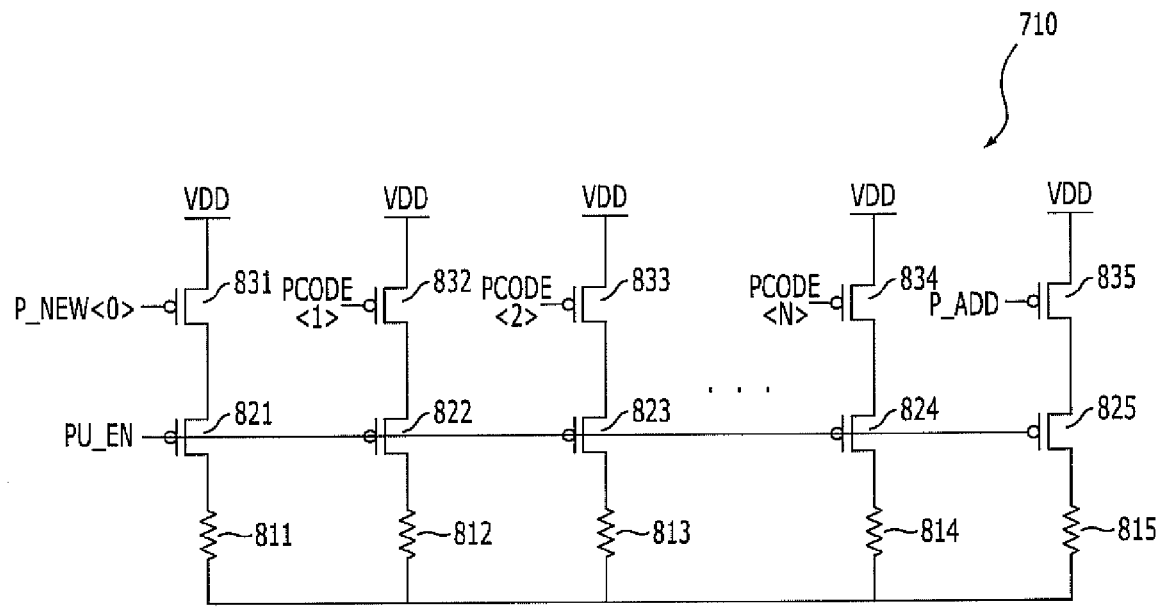
FIG. 8 is an internal configuration diagram of the pull-up termination unit.
Figure 9:
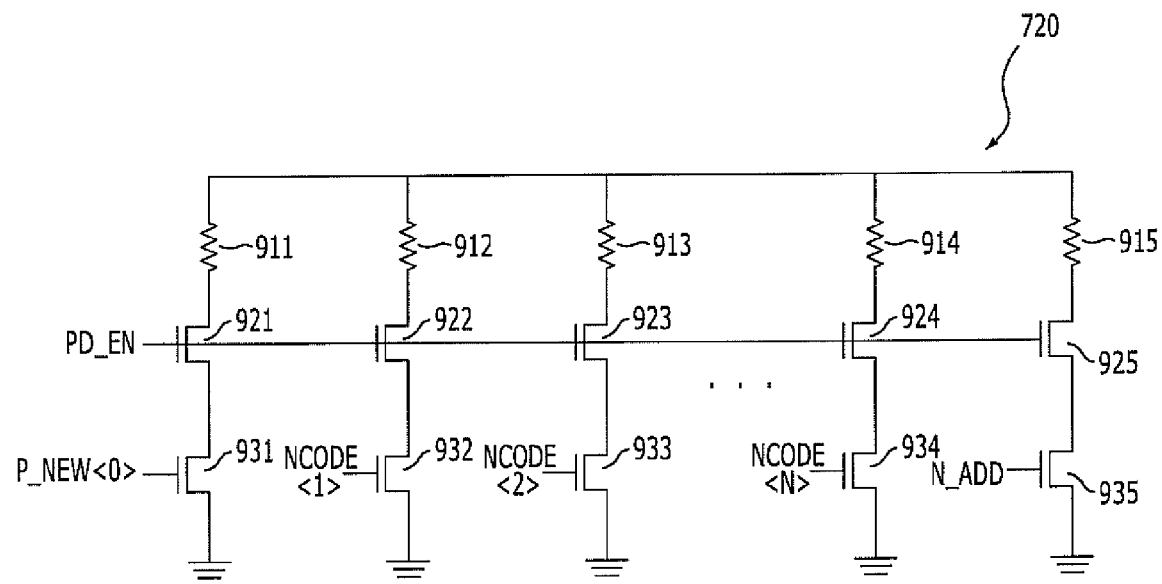
FIG. 9 is an internal configuration diagram of the pull-down termination unit.

FIG. 8 is an internal configuration diagram of the pull-up termination unit 710. FIG. 9 is an internal configuration diagram of the pull-down termination unit 720.

Referring to FIG. 8, the pull-up termination unit 710 includes a plurality of pull-up resistors 811 to 814 enabled to affect termination resistance in response to the pull-up signal PU_EN and the respective bits of the pull-up code PCODE<1:N> and P_NEW<0> and an additional pull-up resistor 815 enabled to affect termination resistance in response to the pull-up signal PU_EN and the additional pull-up signal P_ADD. The plurality of pull-up resistors 811 to 814 are connected in series to transistors 821 to 824 and transistors 831 to 834, respectively. The transistors 821 to 824 are turned on/off in response to the pull-up signal PU_EN, and the transistors 831 to 834 are turned on/off in response to the respective bits of the pull-up code PCODE<1:N> and P_NEW<0>. The additional pull-up resistor 815 is connected in series to a transistor 825 turned on/off in response to the pull-up signal PU_EN and a transistor 835 turned on/off in response to the additional pull-up signal P_ADD. The pull-up signal PU_EN, the respective bits of the pull-up code PCODE<1:N> and P_NEW<0>, and the additional pull-up signal P_ADD have a low value when activated, and have a high value when deactivated.

Referring to FIG. 9, the pull-down termination unit 720 includes a plurality of pull-down resistors 911 to 914 enabled to affect termination resistance in response to the pull-down signal PD_EN and the respective bits of the pull-down code NCODE<1:N> and N_NEW<0> and an additional pull-down resistor 915 enabled to affect termination resistance in response to the pull-down signal PD_EN and the additional pull-down signal N_ADD. The plurality of pull-down resistors 911 to 914 are connected in series to transistors 921 to 924 and transistors 931 to 934, respectively. The transistors 921 to 924 are turned on/off in response to the pull-down signal PD_EN, and the transistors 931 to 934 are turned on/off in response to the respective bits of the pull-down code NCODE<1:N> and N_NEW<0>. The additional pull-down resistor 915 is connected in series to a transistor 925 turned on/off in response to the pull-down signal PD_EN and a transistor 935 turned on/off in response to the additional pull-down signal N_ADD. The pull-down signal PD_EN, the respective bits of the pull-down code NCODE<1:N> and N_NEW<0>, and the additional pull-down signal N_ADD have a high value when activated, and have a low value when deactivated.

Figure 10:
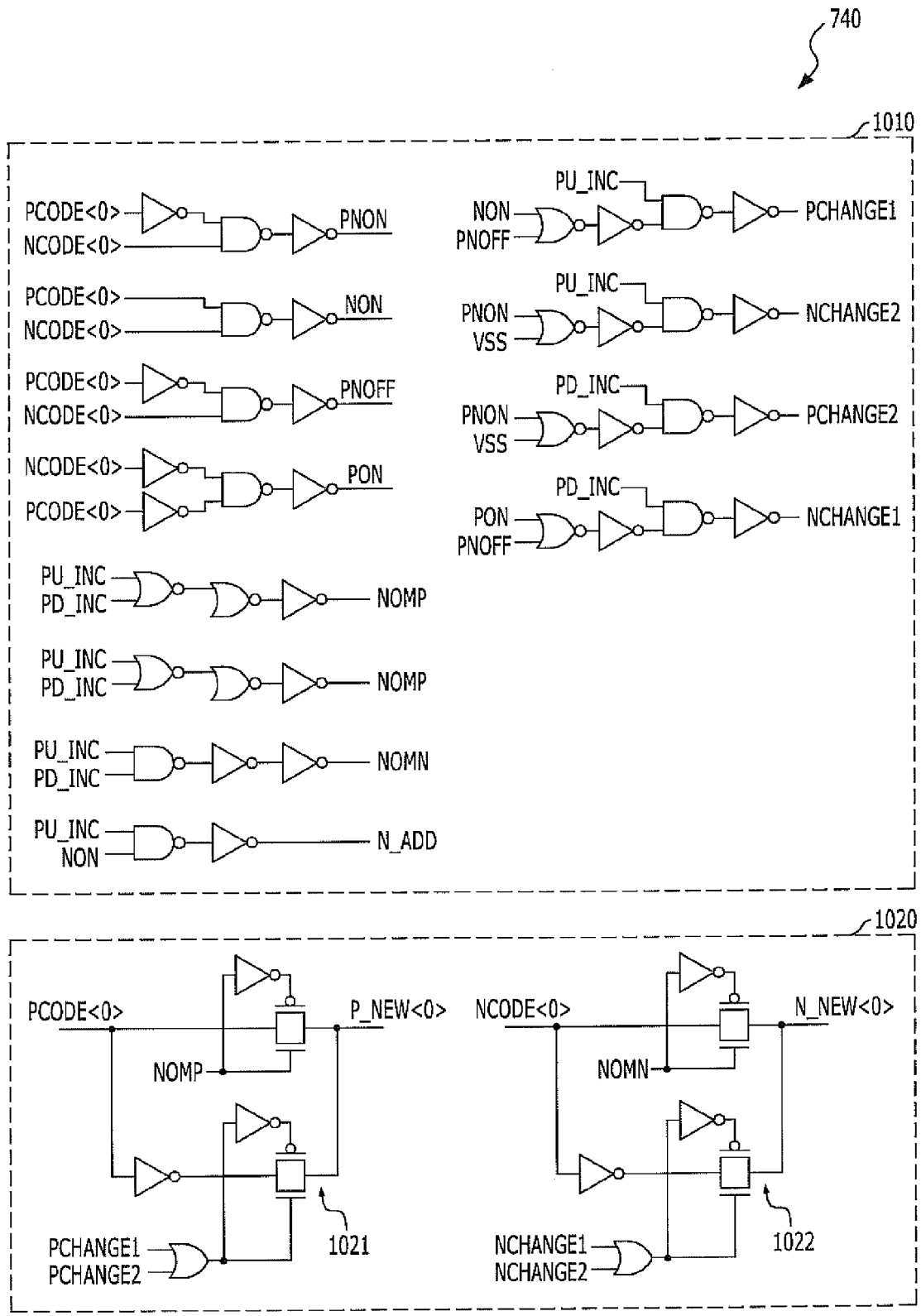
FIG. 10 is a configuration diagram of an impedance control unit.

FIG. 10 is a configuration diagram of the impedance control unit 740.

Referring to FIG. 10, the impedance control unit 740 includes a logic combination circuit 1010 and a code change circuit 1020.

The logic combination circuit 1010 is configured to receive the pull-up increase signal PU_INC, the pull-down increase signal PD_INC, the LSB PCODE<0> of the pull-up code, the LSB NCODE<0> of the pull-down code, and generate state signals PNON, NON, PNOFF, and PON, control signals PCHANGE1, PCHANGE2, NCHANGE1, NCHANGE2, NOMP, and NOMN, an additional pull-up signal P_ADD, and an additional pull-down signal N_ADD. The descriptions of the signals may be checked with reference to Table 1 below.

TABLE 1

| Signal | Meaning | Logic value when activated |
|---|---|---|
| PNON | Turn on resistor corresponding to PCODE<0> and resistor corresponding to NCODE<0> | H(1) |
| NON | Turn on resistor corresponding to NCODE<0> | H(1) |
| PNOFF | Turn off resistor corresponding to PCODE<0> and resistor corresponding to NCODE<0> | H(1) |
| PON | Turn off resistor corresponding to PCODE<0> | H(1) |
| PCHANGE1 | Generate P_NEW<0> by inverting PCODE<0> | H(1) |
| PCHANGE2 | Generate P_NEW<0> by inverting PCODE<0> | H(1) |
| NCHANGE1 | Generate N_NEW<0> by inverting NCODE<0> | H(1) |
| NCHANGE2 | Generate N_NEW<0> by inverting NCODE<0> | H(1) |
| NOMP | Generate P_NEW<0> such that PCODE<0> = P_NEW<0> | H(1) |
| NOMN | Generate N_NEW<0> such that NCODE<0> = N_NEW<0> | H(1) |
| P_ADD | Turn on additional pull-up resistor | L(0) |
| N_ADD | Turn on additional pull-down resistor | H(1) |

The code change circuit 1020 includes two multiplexers 1021 and 1022. The multiplexer 1021 is configured to output the LSB PCODE<0> as the new LSBP_NEW<0> when the control signal NOMP is activated, and invert the LSB PCODE<0> and output the inverted LSB PCODE<0> as the new LSB P_NEW<0> when the control signal PCHANGE1 or the control signal PCHANGE2 is activated. The multiplexer 1022 is configured to output the LSB NCODE<0> as the new LSB N_NEW<0> when the control signal NOMN is activated, and invert the LSB NCODE<0> and output the inverted LSB NCODE<0> as the new LSB N_NEW<0> when the control signal NCHANGE1 or the control signal NCHANGE2 is activated.

Table 2 shows the overall operations of FIGS. 7 to 10.

TABLE 2

| Case | P_INC/ D_INC | PCODE<0> | NCODE<0> | P_NEW<0> | P_NEW<0> | State | Result |
|---|---|---|---|---|---|---|---|
| a-1 | 1/0 | 0 | 0 | 0 | 0 | PON | P__ADD activated |
| b-1 | 1/0 | 0 | 1 | 0 | 0 | PNON | NCHANGE2 activated, NCODE<0> changed |
| c-1 | 1/0 | 1 | 0 | 0 | 0 | PNOFF | PCHANGE1 activated, PCODE<1> changed |
| d-1 | 1/0 | 1 | 1 | 1 | 0 | NON | NCHANGE2 activated, NCODE<0> changed |
| a-2 | 0/1 | 0 | 0 | 0 | 1 | PON | NCHANGE1 activated, NCODE<0> changed |
| b-2 | 0/1 | 0 | 1 | 1 | 1 | PNON | PCHANGE2 activated, PCODE<0> changed |
| c-2 | 0/1 | 1 | 0 | 0 | 1 | PNOFF | NCHANGE1 activated, NCODE<0> changed |
| d-2 | 0/1 | 1 | 1 | 1 | 1 | NON | N__ADD activated |
| a-3 | 0/0 | 0 | 0 | 0 | 0 | PON | No change |
| b-3 | 0/0 | 0 | 1 | 0 | 1 | PNON | No change |
| c-3 | 0/0 | 1 | 0 | 1 | 0 | PNOFF | No change |
| d-3 | 0/0 | 1 | 1 | 1 | 1 | NON | No change |

Referring to Table 2, the operation in each case will be described. When the pull-up increase signal PU_INC is activated, and when the LSB PCODE<0> is activated (0) and the LSB NCODE<0> is deactivated (0) (a-1), the additional pull-up signal P_ADD is activated to 0, because the additional pull-up resistor 815 are to be turned on to relatively increase the impedance value of the pull-up termination unit 710. When the LSB PCODE<0> is activated (0) and the LSB NCODE<0> is activated (1) (b-1), the impedance value of the pull-down termination unit 720 is reduced to relatively increase the impedance value of the pull-up termination unit 710. Therefore, the new LSB N_NEW<0> is generated by inverting the LSB NCODE<0>. When the LSB PCODE<0> is deactivated (1) and the LSB NCODE<0> is deactivated (0) (c-1), the new LSB P_NEW<0> is generated by inverting the LSB PCODE<0>, in order to relatively increase the impedance value of the pull-up termination unit 710. When the LSB PCODE<0> is deactivated (1) and the LSB NCODE<0> is activated (1) (d-1), the impedance value of the pull-down termination unit 720 is reduced to relatively increase the impedance value of the pull-up termination unit 710. Therefore, the new LSB N_NEW<0> is generated by inverting the LSB NCODE<0>.

When the pull-down increase signal PD_INC is activated, and when the LSB PCODE<0> is activated (0) and the LSB NCODE<0> is deactivated (0) (a-2), the new LSB N_NEW<0> is generated by inverting the LSB NCODE<0>, in order to relatively increase the impedance value of the pull-down termination unit 720. When the LSB PCODE<0> is activated (0) and the LSB NCODE<0> is activated (1) (b-2), the impedance value of the pull-up termination unit 710 is reduced to relatively increase the impedance value of the pull-down termination unit 720. Therefore, the new LSB P_NEW<0> is generated by inverting the LSB PCODE<0>. When the LSB PCODE<0> is deactivated (1) and the LSB NCODE<0> is deactivated (0) (c-2), the new LSB N_NEW<0> is generated by inverting the LSB NCODE<0>, in order to relatively increase the impedance value of the pull-down termination unit 720. When the LSB PCODE<0> is deactivated (1) and the LSB NCODE<0> is activated (1) (d-1), the additional pull-down signal N_ADD is activated, because the additional pull-down resistor 915 is to be turned on to increase the impedance value of the pull-down termination unit 720.

When both of the pull-up increase signal PD_INC and the pull-down increase signal PD_INC are deactivated (a-3, b-3, c-3, and d-3), the impedance values of the pull-up termination unit 710 and the pull-down termination unit 720 do not need to be changed. Therefore, PCODE<0> is not changed (PCODE<0>=P_NEW<0>), NCODE<0> is not changed (NCODE<0>=N_NEW<0>), the additional pull-up signal P_ADD is deactivated, and the additional pull-down signal N_ADD is deactivated.

As a result, it can be seen that, when the pull-down increase signal PU_INC is activated, the impedance value of the pull-up termination unit 710 is relatively increased, and when the pull-down increase signal PD_INC is activated, the impedance value of the pull-down termination unit 720 is relatively increased.

In accordance with the embodiments of the present invention, the one or more pull-up resistors, which are enabled to affect termination resistance in response to the pull-up setting value when the termination signal is activated, and the one or more pull-down resistors, which are enabled to affect termination resistance in response to the pull-down setting value when the termination signal is activated, are included in the termination circuit. Therefore, the termination resistance values during data input and during data output may be separately controlled.

While the present invention has been described with respect to the specific embodiments, it will be apparent to those skilled in the art that various changes and modifications may be made without departing from the spirit and scope of the invention as defined in the following claims.

What is claimed is:

1. A termination circuit comprising:
   a pull-up termination unit configured to pull-up terminate an interface node in response to a pull-up signal;
   a pull-down termination unit configured to pull-down terminate the interface node in response to a pull-down signal;
   one or more pull-up resistors connected to the interface node and enabled to affect termination resistance in response to a pull-up setting value when a termination signal is activated; and
   one or more pull-down resistors connected to the interface node and enabled to affect termination resistance in response to a pull-down setting value when the termination signal is activated,
   wherein the termination signal is generated by delaying a termination command by latency and the termination command is inputted from outside a system to which the termination circuit is applied.

2. The termination circuit of claim 1, further comprising a control unit configured to activate the pull-up signal when logic high data is outputted to the interface node, activate the pull-down signal when logic low data is outputted to the interface node, and activate the pull-up signal and the pull-down signal when the termination signal is activated.

3. The termination circuit of claim 1, wherein the pull-up setting value and the pull-down setting value are stored in a fuse circuit.

4. The termination circuit of claim 1, wherein the one or more pull-up resistors and the one or more pull-down resistors are all disabled from affecting the termination resistance when the termination signal is deactivated.

5. The termination circuit of claim 1, wherein the pull-up termination unit is configured to control a resistance value of the pull-up termination unit in response to a pull-up code, the pull-down termination unit is configured to control a resistance value of the pull-down termination unit in response to a pull-down code, and the pull-up code and the pull-down code are generated by a calibration circuit.

6. A termination circuit comprising:
a pull-up termination unit configured to pull-up terminate an interface node in response to a pull-up signal;
a pull-down termination unit configured to pull-down terminate the interface node in response to a pull-down signal; and
one or more pull-up resistors connected to the interface node and enabled to affect termination resistance in response to a pull-up setting value when a termination signal is activated,
wherein the termination signal is generated by delaying a termination command by latency and the termination command is inputted from outside a system to which the termination circuit is applied.

7. A termination circuit comprising:
a pull-up termination unit configured to pull-up terminate an interface node in response to a pull-up signal;
a pull-down termination unit configured to pull-down terminate the interface node in response to a pull-down signal; and
one or more pull-down resistors connected to the interface node and enabled to affect termination resistance in response to a pull-down setting value when a termination signal is activated,
wherein the termination signal is generated by delaying a termination command by latency and the termination command is inputted from outside a system to which the termination circuit is applied.

* * * * *